US009379189B2

(12) United States Patent
Srikrishnan Kashyap et al.

(10) Patent No.: US 9,379,189 B2
(45) Date of Patent: Jun. 28, 2016

(54) METHOD AND SYSTEM FOR TRANSIENT VOLTAGE SUPPRESSION

(71) Applicant: General Electric Company, Schenectady, NY (US)

(72) Inventors: Avinash Srikrishnan Kashyap, Clifton Park, NY (US); Peter Michah Sandvik, Niskayuna, NY (US); Stephen Daley Arthur, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/644,481

(22) Filed: Mar. 11, 2015

(65) Prior Publication Data

US 2015/0187884 A1 Jul. 2, 2015

Related U.S. Application Data

(62) Division of application No. 13/846,380, filed on Mar. 18, 2013, now Pat. No. 8,987,858.

(51) Int. Cl.

| | |
|---|---|
| ***H01L 29/06*** | (2006.01) |
| ***H01L 29/16*** | (2006.01) |
| ***H01L 21/265*** | (2006.01) |
| ***H01L 29/861*** | (2006.01) |
| ***H01L 21/04*** | (2006.01) |

(Continued)

(52) U.S. Cl.

CPC .......... *H01L 29/1608* (2013.01); *H01L 21/046* (2013.01); *H01L 21/0445* (2013.01); *H01L 21/0475* (2013.01); *H01L 21/265* (2013.01); *H01L 29/06* (2013.01); *H01L 29/0661* (2013.01); *H01L 29/0692* (2013.01); *H01L 29/6606* (2013.01); *H01L 29/8618* (2013.01); *H01L 29/32* (2013.01); *H01L 2924/10272* (2013.01)

(58) Field of Classification Search

CPC ............ H01L 29/0661; H01L 29/6606; H01L 2924/10272

See application file for complete search history.

(56) References Cited

U.S. PATENT DOCUMENTS

| | | | |
|---|---|---|---|
| 3,551,783 | A | 12/1970 | Reich |
| 4,278,986 | A | 7/1981 | Mader |

(Continued)

FOREIGN PATENT DOCUMENTS

| | | | |
|---|---|---|---|
| EP | 0537843 A1 | 4/1993 | |
| GB | 1447763 | 9/1976 | |

OTHER PUBLICATIONS

Peter J. Kannam, "Design Concepts of High Energy Punchthrough Structures," IEEE Transactions on Electron Devices, vol. Ed. 23, No. 8, Aug. 1976, pp. 879-882.

(Continued)

*Primary Examiner* — Phat X Cao
(74) *Attorney, Agent, or Firm* — John P. Darling

(57) ABSTRACT

A transient voltage suppression (TVS) device includes a first layer of wide band gap semiconductor material formed of a first conductivity type material, a second layer of wide band gap semiconductor material formed of a second conductivity type material over at least a portion of the first layer and comprising an ion implanted material structure between 0.1 micrometers (μm) and 22.0 μm thick, the second layer operating using punch-through physics, and a third layer of wide band gap semiconductor material formed of the first conductivity type material over at least a portion of the second layer.

15 Claims, 4 Drawing Sheets

102
120
116
122
124
118
114
110
108
106
104
112

(51) Int. Cl.
*H01L 29/66* (2006.01)
*H01L 29/32* (2006.01)

(56) References Cited

U.S. PATENT DOCUMENTS

| | | | |
|---|---|---|---|
| 4,325,097 | A | 4/1982 | Clark |
| 5,103,289 | A | 4/1992 | Brady |
| 6,015,999 | A | 1/2000 | Yu et al. |
| 6,489,660 | B1 | 12/2002 | Einthoven et al. |
| 6,689,669 | B2 | 2/2004 | Kurtz et al. |
| RE38,608 | E | 10/2004 | Yu et al. |
| 6,867,436 | B1 | 3/2005 | Matteson et al. |
| 6,900,108 | B2 | 5/2005 | Kurtz et al. |
| 7,339,776 | B1 | 3/2008 | Hertel et al. |
| 7,361,942 | B1 | 4/2008 | Matteson et al. |
| 7,391,057 | B2 | 6/2008 | Ryu et al. |
| 7,510,903 | B1 | 3/2009 | Matteson et al. |
| 7,532,445 | B2 | 5/2009 | Rana |
| 7,668,295 | B2 | 2/2010 | Tang et al. |
| 7,728,404 | B2 | 6/2010 | Van Dalen et al. |
| 8,530,902 | B2 * | 9/2013 | Kashyap et al. ................ 257/76 |
| 2002/0195689 | A1 | 12/2002 | Lee et al. |
| 2003/0084748 | A1 | 5/2003 | Shimizu et al. |
| 2003/0211706 | A1 | 11/2003 | Kurtz et al. |
| 2005/0006731 | A1 | 1/2005 | O'Shea et al. |
| 2006/0181822 | A1 | 8/2006 | Rana et al. |
| 2006/0261345 | A1 | 11/2006 | Ryu et al. |
| 2008/0079126 | A1 | 4/2008 | Autry et al. |
| 2008/0285716 | A1 | 11/2008 | Tang et al. |
| 2009/0015978 | A1 | 1/2009 | Clark |
| 2009/0115018 | A1 | 5/2009 | Mallikarjunaswamy |
| 2009/0250720 | A1 | 10/2009 | Saucedo-Flores et al. |
| 2009/0290276 | A1 | 11/2009 | Carcouet et al. |
| 2010/0109147 | A1 | 5/2010 | Autry |
| 2010/0127365 | A1 | 5/2010 | Galera et al. |
| 2010/0237356 | A1 | 9/2010 | Haney et al. |
| 2011/0058299 | A1 | 3/2011 | Simi |

OTHER PUBLICATIONS

Hagler et al., "SiC Die Attach Metallurgy and Processes for Applications up to 500° C.," IEEE Transactions on Components, Packaging and Manufacturing Technology, vol. 1, No. 4, Apr. 2011, pp. 630-639.

* cited by examiner

METHOD AND SYSTEM FOR TRANSIENT VOLTAGE SUPPRESSION

BACKGROUND

This description relates to semiconductor devices, and, more particularly, to transient voltage suppressors (TVS) and methods of forming them using wide-band gap materials.

At least some known bidirectional punch-through TVS structures are not symmetrical in terms of electrical performance. In certain devices, such as TVS devices formed of SiC semiconductor material where the etched sidewalls have defects, which are a path for leakage current. Such defects are a risk as they may cause one of the junctions to break down at a different voltage than the other junction, making the performance asymmetrical.

Moreover, control of the integrated charge in each semiconductor layer provides greater control over the ability of the device to operate at particular circuit conditions. Epitaxy provides good control in many cases, however, especially for low voltage operation, epitaxial layers do not provide sufficient control of integrated charge.

SUMMARY

In one embodiment, a transient voltage suppression (TVS) device includes a first layer of wide band gap semiconductor material formed of a first conductivity type material, a second layer of wide band gap semiconductor material formed of a second conductivity type material over at least a portion of the first layer and comprising an ion implanted material structure between 0.1 micrometers (μm) and 22.0 μm thick, the second layer operating using punch-through physics, and a third layer of wide band gap semiconductor material formed of the first conductivity type material over at least a portion of the second layer.

In another embodiment, a method of forming a transient voltage suppression (TVS) device having a mesa structure includes providing a silicon carbide substrate having a first surface and an opposite second surface, doped with a dopant of a first conductivity type, forming a first silicon carbide layer having a conductivity of a first polarity, forming a second punch-through layer having a conductivity of a second polarity over at least a portion of the first surface wherein a positive bevel is formed at a junction between the doped substrate layer and the punch-through layer, forming a third layer having a conductivity of the first polarity over at least a portion of the punch-through layer wherein a negative bevel is formed at a junction between the punch-through layer and the third layer, and implanting ions into an edge region of the negative bevel wherein a resistance of the second punch-through layer and the third layer in the implanted region is increased by the implantation of the ions.

In yet another embodiment, a transient voltage suppression (TVS) device includes a first layer of wide band gap semiconductor material formed of a first conductivity type material, a second layer of wide band gap semiconductor material formed of a second conductivity type material over at least a portion of the first layer and comprising an ion implanted material structure between 0.1 micrometers (μm) and 22.0 μm thick, the second layer operating using punch-through physics, and a third layer of wide band gap semiconductor material formed of the first conductivity type material over at least a portion of the second layer, wherein a junction between said second layer and said third layer comprises a negative bevel and wherein an edge region of the negative bevel comprises an ion implanted structure having a relatively higher resistance than the remainder of the second layer and the third layer due to the implantation of the ions.

BRIEF DESCRIPTION OF THE DRAWINGS

FIG. 1 is a side elevation view of a transient voltage suppression (TVS) semiconductor device in accordance with an exemplary embodiment of the present system.

FIG. 2 is a TVS device in accordance with an exemplary embodiment of the present disclosure.

FIG. 3 is a flow diagram of a method of forming a transient voltage suppression (TVS) device having a mesa structure.

FIG. 4 is a flow diagram of another method of forming a transient voltage suppression (TVS) device having a mesa structure.

Figure 1:
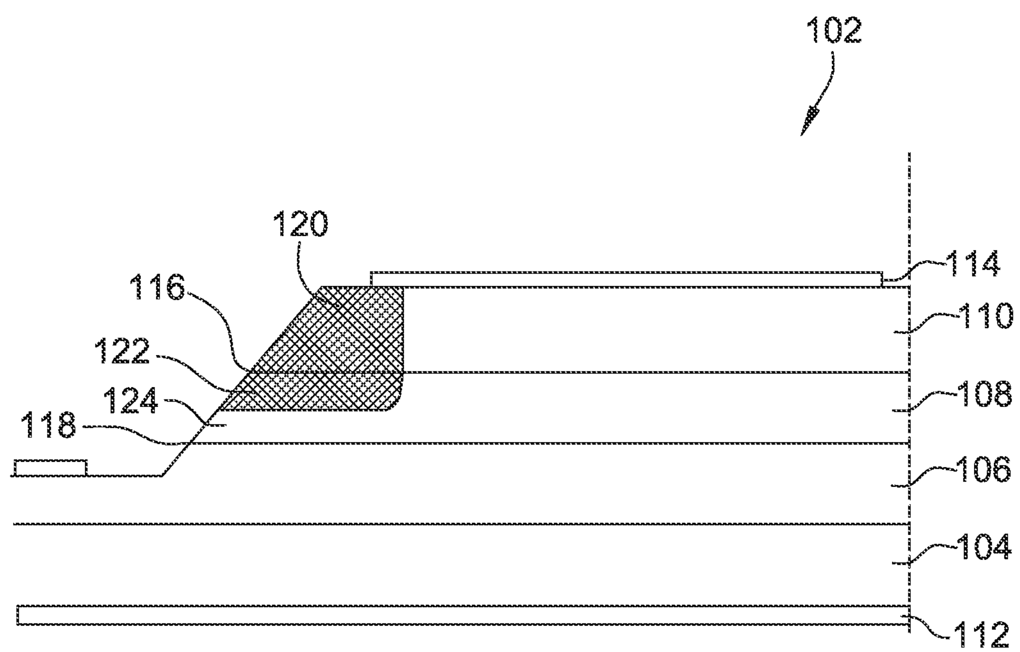
FIGS. 1-4 show exemplary embodiments of the method and apparatus described herein.

Although specific features of various embodiments may be shown in some drawings and not in others, this is for convenience only. Any feature of any drawing may be referenced and/or claimed in combination with any feature of any other drawing.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

The following detailed description illustrates embodiments of the technology by way of example and not by way of limitation. It is contemplated that the technology has general application to analytical and methodical embodiments of forming semiconductor devices in industrial, commercial, and residential applications.

The advantage to symmetrical TVS devices is that they provide protection for both polarities of the terminal voltages. The use of punch-through physics to limit the overvoltage of the terminals allows the device breakover voltage to be set well below electric fields strengths required for avalanche processes which are commonly used in silicon technology as the voltage limiting mechanism. Avalanche breakdown based devices can be unstable due to the possibility of local hot spots occurring in material defects or areas of local nonuniformities. Lowering the required electric field strength at breakover voltage also eases the design constraints put on the junction edges. Punch-through devices can be made with only three layers of epitaxy while avalanche devices require five or more. Such features make symmetrical punch-through devices cost effective compared to the alternatives.

To provide a tightly controlled integrated charge in device conduction layers, epitaxy based TVS punch-through structures with structures created by a combination of epitaxy and high energy implantation are described herein. One of the critical design parameters is the punch-through voltage, which for N+/P/N+ structures with a uniformly doped base is given by:

$$Vpt(N,T)=(q/2*k*\in)(N*T^2),\text{ where}$$

N represents the net doping of the lower doped uniform base layer (#/cm3),

T represents the base width commercial epitaxial specifications (for P-dopants) are specified as +/−50% for doping, and +/−10% for thickness control (for layers >0.1 um thick), q is the unit of elementary charge (1.6E-19 Coulombs), k is the relative permittivity of the wide bang gap material (e.g. 9.7 for SiC), and $\in$ is the permittivity of vacuum (8.854E-14 F/cm)

Ion implantation can control dose to +1-1.5% and ion energy (related to depth) to 3%. Described herein are methods by which superior Vpt control can be achieved by using ion implantation as the principle means of doping the base for punch-through TVS structures.

The following description refers to the accompanying drawings, in which, in the absence of a contrary representation, the same numbers in different drawings represent similar elements.

FIG. 1 is a side elevation view of a transient voltage suppression (TVS) semiconductor device 102 in accordance with an exemplary embodiment of the present system. In the exemplary embodiment, device 102 includes a mesa structure that is formed of a substrate 104 of for example, silicon carbide having an n type conductivity and an epitaxially grown n type conductivity layer 106, an epitaxially grown p− layer 108 coupled in electrical contact with layer 106, and an epitaxially grown n+ layer 110 coupled in electrical contact with p− layer 108. Substrate 104 is typically doped with a dopant of a first conductivity type during substrate growth, or by epitaxy, implant, or diffusion processes.

In various embodiments, layer 110 and/or layer 108 may be formed by ion-implantation. For example, in an embodiment substrate 104 is an n+ layer, a very lightly doped n− epitaxy layer is formed on substrate 104, the n− epitaxy layer is then converted to a p− layer 108 by ion implantation and n+ layer 110 may also be formed on layer 108 with an n+ implantation.

For relatively low voltage applications, forming layer 108 and/or layer 110 by ion implantation may provide tighter control of the integrated charge of these layers, which in turn permits more accurate control of the electrical characteristics of TVS semiconductor device 102.

In the exemplary embodiment, p− layer 108 is relatively lightly doped relative to layers 106 and 110. A uniform doping concentration of substrate 104 and layers 106, 108, and 110 improves a uniformity of the electric field distribution in the depletion region, thereby improving the breakdown voltage characteristic. Moreover, the mesa structure has a beveled sidewall angled approximately five degrees to approximately eighty degrees with respect to an interface between adjacent contacting layers to reduce the maximum electric field profile at a surface of the die. A junction 116 between layers 108 and 110 includes a negative bevel, which causes an increased peak electric field and a junction 118 between layers 106 and 108 includes a positive bevel, which causes a reduced peak electric field. Such a configuration is asymmetrical. A more symmetrical configuration is obtained by ion implantation of an edge region 120 of layer 110 and a portion 122 of an edge region 124 of layer 108. In the exemplary embodiment, hydrogen ($H_2$) is used in the ion implantation process. Ion implantation of hydrogen tends to increase a resistivity of region 120 and portion 122 such that current flowing through punch-through layer 108 during punch-through operation is more uniform with the higher resistance in region 120 making the configuration of TVS semiconductor device 102 more symmetrical. In various embodiments, any ion of sufficient dose to approach amorphization of SiC creates damage to the SiC crystalline structure thereby increasing the resistivity of the layer in the area of damage. For example, hydrogen, argon, and nitrogen ion implantation have been shown to increase the resistivity of SiC. Implant damage can be created by any ion type, however, in the exemplary embodiments, ions that are chemically neutral, for example, but not limited to He, Ar, and Kr and those that may form dielectric compounds with SiC, for example, but not limited to oxygen and nitrogen are used. Moreover, self-damaging ions, for example, silicon and carbon are also used as these would also limit undesirable chemical compound formation.

A first electrical contact 112 is coupled in electrical contact with substrate 104. A second electrical contact 114 is coupled in electrical contact with epitaxially grown n+ layer 110. Semiconductor device 102 operates using "punch-through," or also known as, "reach-through" physics such that as the voltage across semiconductor device 102 is increased, a depletion region extends all across P− layer 108 and touches n layer 106 and n+ layer 110. This leads to a condition known as "punch-through" and large amounts of current are able to flow through semiconductor device 102. Semiconductor device 102 is able to maintain this condition with minimal change in the voltage across it.

In various embodiments, semiconductor device 102 is sized and formed to ensure a maximum electric field internal to the semiconductor material of semiconductor device 102 is maintained less than about two megavolts per centimeter. Additionally, semiconductor device 102 is configured to maintain an increase in blocking voltage of less than 5% for current in a range of less than approximately 1.0 nanoamp to approximately 1.0 milliamp. As used herein, blocking voltage refers to the highest voltage at which semiconductor device 102 does not conduct or is still in an "off" state. Moreover, semiconductor device 102 is configured to maintain an electrical leakage current of less than approximately 1.0 microamp up to approximately the punch-through voltage of semiconductor device 102 at room temperature and less than 100.0 microamp up to approximately the punch-through voltage at operating temperatures of up to 225° Celsius.

In various embodiments, semiconductor device 102 is configured to exhibit punch-through characteristics between approximately 5.0 volts to approximately 75.0 volts. In various other embodiments, semiconductor device 102 is configured to exhibit punch-through characteristics between approximately 75.0 volts to approximately 200.0 volts. In still other embodiments, semiconductor device 102 is configured to exhibit punch-through characteristics greater than approximately 200 volts.

Figure 2:
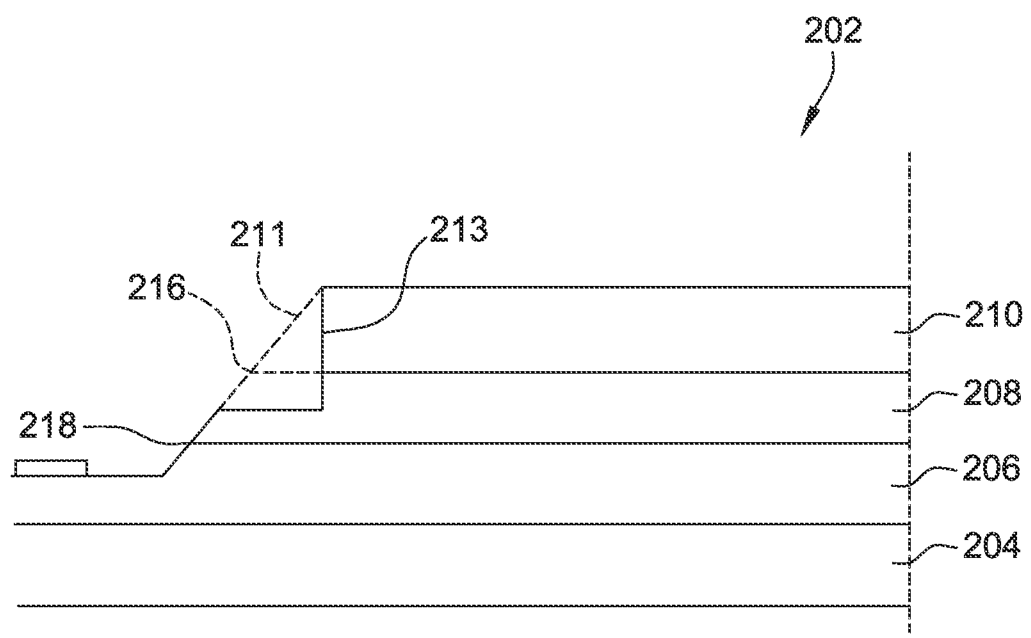

FIG. 2 is a TVS device 202 in accordance with an exemplary embodiment of the present disclosure. In the exemplary embodiment, device 202 includes a dual mesa structure that is formed of a substrate 204 of for example, silicon carbide having homo-epitaxial layers of n type conductivity layer 206, an epitaxially grown p− layer 208 coupled in electrical contact with layer 206, and an epitaxially grown n+ layer 210 coupled in electrical contact with p− layer 208. In various embodiments, layer 210 and/or layer 208 may be formed by ion-implantation. For example, in an embodiment substrate 204 is an n+ layer, a very lightly doped n− epitaxy layer is formed on substrate 204, the n− epitaxy layer is then converted to a p− layer 208 by ion implantation and n+ layer 210 may also be formed on layer 208 with an n+ implantation. For relatively low voltage applications, forming layer 208 and/or layer 210 by ion implantation may provide tighter control of the integrated charge of these layers, which in turn permits more accurate control of the electrical characteristics of TVS semiconductor device 202.

In the exemplary embodiment, p− layer 208 is relatively lightly doped relative to layers 206 and 210. A uniform doping concentration of substrate 204 and layers 206, 208, and 210 improves a uniformity of the electric field distribution in the depletion region, thereby improving the breakdown voltage characteristic.

Moreover, in fabrication, the mesa structure is formed with a beveled sidewall 211 (shown in part by dotted line) angled approximately five degrees to approximately eighty degrees with respect to an interface between adjacent contacting layers to reduce the maximum electric field profile at a surface of the die. A junction 216 between layers 208 and 210 includes a negative bevel, which causes an increased peak electric field and a junction 218 between layers 206 and 208 includes a positive bevel, which causes a reduced peak electric field. Such a configuration is asymmetrical. A more symmetrical configuration is obtained by etching a sidewall 213 of the mesa structure using a mask forming a substantially vertical sidewall. The formation of such a sidewall requires the exposed junction to be sufficiently passivated using grown or deposited dielectric films. Similar to the ion implantation method shown in FIG. 1, current flowing through punch-through layer 208 during punch-through operation is more uniform with etched out portion making the configuration of TVS semiconductor device 202 more symmetrical.

Optionally, electrical contacts (not shown in FIG. 2) may be coupled in electrical contact with substrate 204 and n+ layer 210. Semiconductor device 202 operates using "punch-through," or also known as, "reach-through" physics such that as the voltage across semiconductor device 202 is increased, a depletion region extends all across P− layer 208 and touches n layer 206 and n+ layer 210. This leads to a condition known as "punch-through" and large amounts of current are able to flow through semiconductor device 202. Semiconductor device 202 is able to maintain this condition with minimal change in the voltage across it.

In various embodiments, semiconductor device 202 is sized and formed to ensure a maximum electric field internal to the semiconductor material of semiconductor device 202 is maintained less than about two megavolts per centimeter. Additionally, semiconductor device 202 is configured to maintain an increase in blocking voltage of less than 5% for current in a range of less than approximately 1.0 nanoamp to approximately 1.0 milliamp. As used herein, blocking voltage refers to the highest voltage at which semiconductor device 202 does not conduct or is still in an "off" state. Moreover, semiconductor device 202 is configured to maintain an electrical leakage current of less than approximately 1.0 microamp up to approximately the punch-through voltage of semiconductor device 202 at room temperature and less than 100.0 microamp up to approximately the punch-through voltage at operating temperatures of approximately 150° Celsius and up to 225° Celsius.

In various embodiments, semiconductor device 202 is configured to exhibit punch-through characteristics between approximately 5.0 volts to approximately 75.0 volts. In various other embodiments, semiconductor device 202 is configured to exhibit punch-through characteristics between approximately 75.0 volts to approximately 200.0 volts. In yet other embodiments, semiconductor device 202 is configured to exhibit punch-through characteristics greater than 200 volts. In still other embodiments, semiconductor device 202 is configured to exhibit punch-through characteristics greater than approximately 600 volts.

Figure 3:
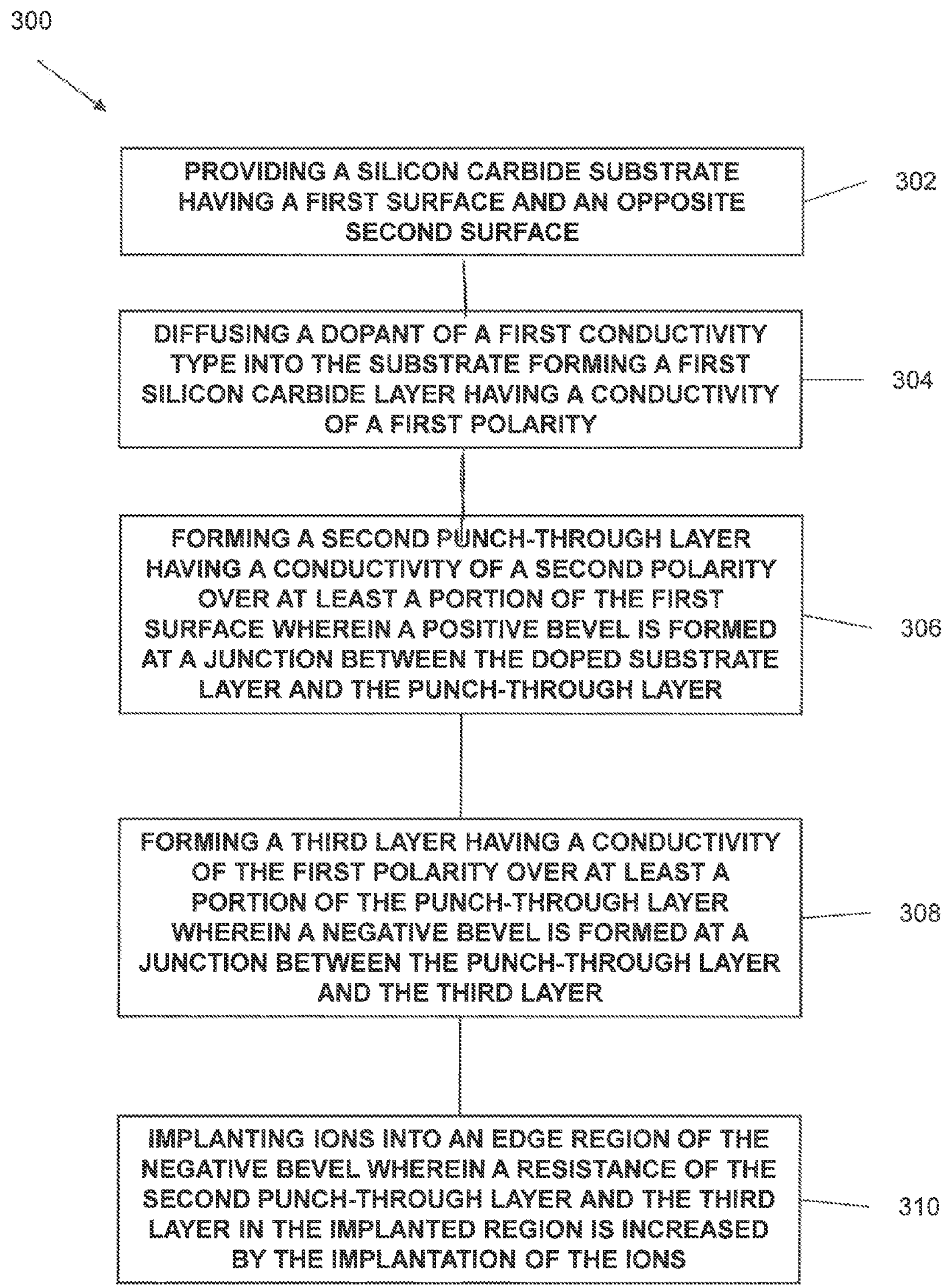

FIG. 3 is a flow diagram of a method 300 of forming a transient voltage suppression (TVS) device having a mesa structure. In the exemplary embodiment, method 300 includes providing 302 a silicon carbide substrate having a first surface and an opposite second surface doped with a dopant of a first conductivity type during substrate growth, or by epitaxy, implant, or diffusion processes, forming 306 a second punch-through layer having a conductivity of a second polarity over at least a portion of the first surface wherein a positive bevel is formed at a junction between the doped substrate layer and the punch-through layer, forming 308 a third layer having a conductivity of the first polarity over at least a portion of the punch-through layer wherein a negative bevel is formed at a junction between the punch-through layer and the third layer, and implanting 310 ions into an edge region of the negative bevel wherein a resistance of the second punch-through layer and the third layer in the implanted region is increased by the implantation of the ions.

Figure 4:
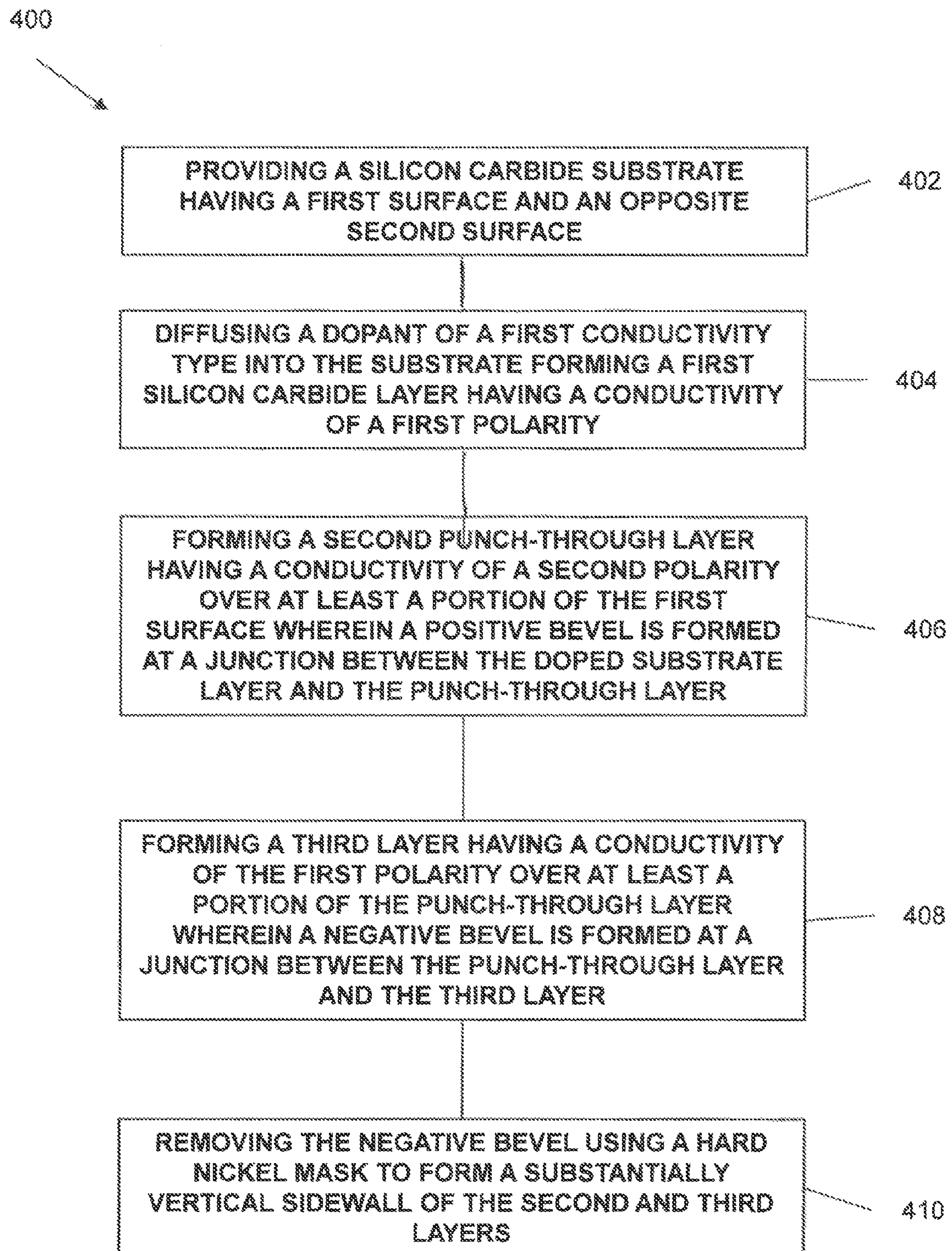

FIG. 4 is a flow diagram of another method 400 of forming a transient voltage suppression (TVS) device having a mesa structure. In the exemplary embodiment, method 400 includes providing 402 a silicon carbide substrate having a first surface and an opposite second surface, diffusing 404 a dopant of a first conductivity type into the substrate forming a first silicon carbide layer having a conductivity of a first polarity, forming 406 a second punch-through layer having a conductivity of a second polarity over at least a portion of the first surface wherein a positive bevel is formed at a junction between the doped substrate layer and the punch-through layer, forming 408 a third layer having a conductivity of the first polarity over at least a portion of the punch-through layer wherein a negative bevel is formed at a junction between the punch-through layer and the third layer, and removing 410 the negative bevel using a hard mask to form a substantially vertical sidewall of the second and third layers The logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It will be appreciated that the above embodiments that have been described in particular detail are merely example or possible embodiments, and that there are many other combinations, additions, or alternatives that may be included.

Also, the particular naming of the components, capitalization of terms, the attributes, data structures, or any other programming or structural aspect is not mandatory or significant, and the mechanisms that implement the invention or its features may have different names, formats, or protocols. Further, the system may be implemented via a combination of hardware and software, as described, or entirely in hardware elements. Also, the particular division of functionality between the various system components described herein is merely one example, and not mandatory; functions performed by a single system component may instead be performed by multiple components, and functions performed by multiple components may instead performed by a single component.

While the disclosure has been described in terms of various specific embodiments, it will be recognized that the disclosure can be practiced with modification within the spirit and scope of the claims.

The above-described embodiments of a method and system of forming a transient voltage suppression (TVS) device having a mesa structure provides a cost-effective and reliable means for improving semiconductor layer charge using ion implantation. More specifically, the methods and systems described herein facilitate using ion implantation instead of simple epitaxy to form TVS device layers. In addition, the above-described methods and systems facilitate forming a symmetrical TVS device using ion implantation or a mask. As a result, the methods and systems described herein facilitate improving the punch-through characteristics of a TVS device in a cost-effective and reliable manner.

This written description uses examples to disclose the claimed inventions, including the best modes, and also to enable any person skilled in the art to practice the inventions, including making and using any devices or systems and performing any incorporated methods. The patentable scope of the inventions is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A transient voltage suppression (TVS) device having a mesa structure, the TVS device comprising:

a first layer of wide band gap semiconductor material formed of a first conductivity type material;

a second layer of wide band gap semiconductor material formed of a second conductivity type material over at least a portion of the first layer and comprising an ion implanted material structure between 0.1 micrometers (μm) and 22.0 μm thick, the second layer operating using punch-through physics;

a third layer of wide band gap semiconductor material formed of the first conductivity type material over at least a portion of the second layer; and a junction between said second layer and said third layer comprising a negative bevel, wherein an edge region of the negative bevel comprises an ion implanted structure having a relatively higher resistance than the remainder of the second layer and the third layer due to the implantation of the ions.

2. The device of claim 1, wherein said third layer of wide band gap semiconductor material comprises an ion implanted material structure.

3. The device of claim 1, wherein the junction between said second layer and said third layer comprises an edge region that has a relatively higher resistance than the remainder of the second layer and the third layer.

4. The device of claim 1, wherein said first layer, said second layer and said third layer comprises an epitaxial structure where the molecular arrangement of one of said first layer, said second layer and said third layer is defined by the crystallographic and chemical features of an adjacent one of said first layer, said second layer and said third layer.

5. The device of claim 1, wherein said second layer comprises a relatively lightly doped n− epitaxy layer converted to a p− conductivity layer having an ion implanted structure.

6. A transient voltage suppression semiconductor device, comprising:

a substrate of a wide band gap semiconductor material;

a first layer of a first conductivity type on the substrate;

a second layer of a second conductivity type on the first layer, the second layer operating using punch-through physics; and a third layer of the first conductivity type on the second layer, wherein an edge region of the first, second and third layers has a mesa structure having a beveled sidewall angled about five to about eighty degrees with respect to an interface between adjacent layers, wherein the device is sized and formed to have a maximum internal electric field internal less than about two megavolts per centimeter.

7. The device of claim 6, wherein an electrical leakage current of the device is less than approximately 1.0 microamp up to approximately the punch-through voltage of the semiconductor device at room temperature and less than 100.0 microamp up to approximately the punch-through voltage at operating temperatures of up to 225° C.

8. The device of claim 6, wherein the second layer exhibits punch-through characteristics between approximately 5.0 volts to approximately 200.0 volts.

9. The device of claim 6, wherein the wide band gap semiconductor material is silicon carbide.

10. The device of claim 6, wherein the second and third layers are epitaxially grown layers.

11. The device of claim 10, wherein the second and third layers are formed by ion implantation of the epitaxially grown layers.

12. The device of claim 6, wherein the substrate is doped with dopants of the first conductivity and the first layer is a doped epitaxy layer formed on the substrate.

13. The device of claim 6, wherein the second layer is relatively lightly doped relative to the first and third layers.

14. The device of claim 6, wherein the substrate and the first, second, and third layers have a uniform doping concentration.

15. The device of claim 6, wherein a first peak electric field of a first junction between the first and second layers and a second peak electric field of a second junction between the second and third layers are substantially symmetrical.

* * * * *